STABLE FREQUENCY GENERATOR SYSTEM
Filed Oct. 18, 1950
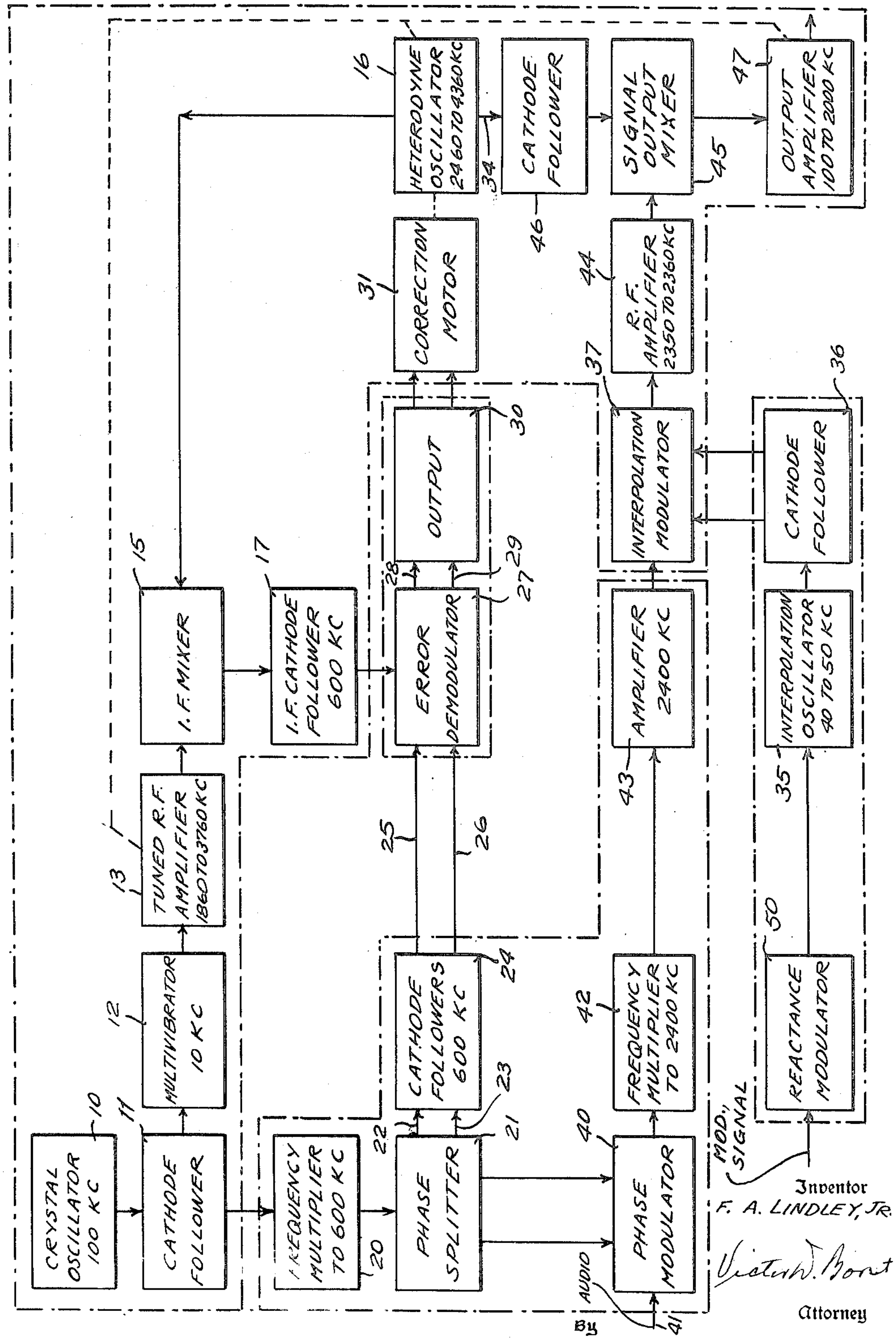
Inventor
F. A. LINDLEY, JR.
By Victor D. Borst
Attorney Patented Sept. 7, 1954

2,688,730

UNITED STATES PATENT OFFICE 2,688,730

STABLE FREQUENCY GENERATOR SYSTEM

Frederick A. Lindley, Jr., Flushing, N. Y., assignor to Smith-Meeker Engineering Co., New York, N. Y., a corporation of New York Application October 18, 1950, Serial No. 190,790

8 Claims. (Cl. 332—19)

This invention relates to a method of generating a sine wave signal with a high degree of frequency stability, which can be varied to any frequency over its operating range and is adapted to be modulated with frequency modulation, phase modulation, or D. C. carrier shift modulation.

An object of the invention is to provide a system of the above type utilizing a single crystal controlled oscillator for controlling the frequency stability of the generated wave while permitting adjustment of the wave to various frequencies over a given range.

Another object is to provide a circuit of the above type utilizing a single crystal controlled oscillator for frequency stabilization purposes and including means for accurately adjusting the frequency over a substantial range.

Another object is to provide a system of the above type having novel and improved means for obtaining frequency selection.

Another object is to provide a system of the above type wherein the output is obtained as a variable single frequency standard without the necessity of intricate filtering and shielding to obtain low spurious responses.

Various other objects and advantages will be apparent as the nature of the invention is more fully disclosed.

In accordance with the present invention, a high frequency variable oscillator is stabilized at various multiples of a stable crystal controlled oscillator by a comparison and correction circuit so that a high stability of the high frequency oscillator is obtained at the various multiple frequency points. The output of this oscillator is combined with the output of an interpolation oscillator operating at substantially lower frequencies and continuously adjustable within the range between successive points of stabilization of the high frequency oscillator. The low frequency oscillator, because of its low operating frequency, has a cyclic stability comparable to the cyclic stability of the crystal stabilized high frequency oscillator.

The nature of the invention will be better understood by referring to the following description, taken in connection with the accompanying drawing in which a specific embodiment thereof has been shown for purposes of illustration.

In the drawing the figure is a block diagram illustrating a circuit embodying the present invention.

Referring to the figure in the drawing, a crystal controlled oscillator 10, of any standard construction, is operated at a predetermined stable frequency indicated for purposes of illustration as 100 kc. The output of the oscillator 10 is applied to a cathode follower stage 11 in order to isolate the crystal circuit and to prevent reaction thereon of the following circuits. The output of the cathode follower stage 11 is divided into two paths. One path is connected to synchronize a harmonic generator 12 operating at a controlled frequency which may be fundamental, or a multiple or submultiple of the frequency of the crystal controlled oscillator. In this case it is shown as a multivibrator operating at 10 kc. The multivibrator 12 is of the type generating a long series of harmonics at 10 kc. intervals and is connected to amplifier 13 which is tunable to pass the selected harmonics in the desired range, for example, between 1860 kc. and 3760 kc. All of these harmonics are of course highly stable in frequency due to the stability of the crystal oscillator 10.

The output of the tuned amplifier 13 is applied to a mixing stage 15. A heterodyne oscillator 16 which is adjustable over a range of frequencies of, for example, from 2460 kc. to 4360 kc., is also connected to the mixer 15 wherein its output is combined with the signal passed by the tuned amplifier 13 to produce a signal having a frequency equal to the difference of the two applied frequencies. This difference frequency is supplied from the mixer 15 to a tuned amplifier 17, shown as a cathode follower, which is adapted to isolate the preceding circuits and is tuned to select the difference frequency. The heterodyne oscillator 16 is ganged with the tuning control of the tuned amplifier 13 in such a way as to produce a constant frequency difference between the two signals suppled to the mixer 15. In the above examples a frequency difference is selected as 600 kc.

The second output path from the cathode follower 11 is connected to a frequency multiplier 20 which is adapted to multiply the impressed frequency several times. In the example indicated the frequency is multiplied by the frequency multiplier 20 to a frequency of 600 kc. This 600 kc. signal which is a fixed multiple of the frequency of the crystal oscillator 10, is supplied to a phase splitting circuit 24 having two output paths. One of the output paths comprises channels 22 and 23 which carry stabilized 600 kc. signals of 90° phase difference. The channels 22 and 23 are connected to cathode followers 24 for isolating the phase splitting and frequency multiplier circuits and the output of the cathode followers is supplied through channels 25 and 26 to a demodulation circuit 27 to which the output of the cathode follower 17 is also supplied. The demodulation circuit 27 is adapted to produce in output channels 28 and 29 signals having a frequency corresponding to the difference between the stabilized 600 kc. signals derived from the frequency multiplier and the signal received through the cathode follower 17 from the mixer 15. These signals in channels 28 and 29, which are 90° out of phase, are passed to an output amplifier 30 and thence to a correction motor 31 of the type which is adapted to operate at a rate and in a direction determined by the sign of the error between the stabilized 600 kc. signal derived from the frequency multiplier 20 and the 600 kc. signal derived from the mixer 15. The correction motor 31 is connected to adjust the frequency of the heterodyne oscillator 16 in a direction to correct such error so that the heterodyne oscillator 16 is maintained at the exact frequency required to beat with the frequency to which the tuned amplifier 13 is tuned and produce a 600 kc. beat wave.

Since the series of harmonics passed by the amplifier 13 are spaced in frequency by 10 kilocycles, the heterodyne oscillator 16 will be held accurately at any selected frequency between 2460 kc. and 4360 kc. in steps of 10 kc. each. The particular frequency within this range to which the heterodyne oscillator is adjusted may be indicated by suitable markings on the tuning control of the amplifier 13. Hence the output 34 of the heterodyne oscillator 16 constitutes a frequency stabilized wave which may be adjusted accurately within the range specified in steps of 10 kc. each and may be used as the output of the system if interpolation between these 10 kc. steps is not required.

In order to interpolate the 10 kc. steps of the heterodyne oscillator 16 an interpolation oscillator 35 is provided which is of a highly stable type and may be continuously adjusted over a range of, for example, between 40 kc. and 50 kc., the adjustment being suitably indicated on a dial for convenience. The output of the interpolation oscillator 35 is supplied to a cathode follower 36, thence as a modulating wave to a balanced modulator 37 which is adapted to eliminate the carrier.

The phase splitting circuit 21 also feeds the 600 kc. wave to a phase modulator 40 wherein it is phase modulated by an audio signal from a channel 41. This phase modulated signal from the modulator 40 is passed through a frequency multiplier 42 wherein the frequency is multiplied a plurality of times, such as four times to a frequency of 2400 kc., so as to increase the phase swing and is then passed through an amplifier 43 and applied as a carrier to the balanced modulator 37.

The balanced modulator 37 carries a carrier of 2400 kc. with side bands spaced 40 kc. to 50 kc. on either side thereof depending upon the frequency of the interpolation oscillator 35. Due to the balanced modulator the 2400 kc. carrier is substantially suppressed and the side band output is supplied to an amplifier 44 which is of the band pass type and is adequately selective over the range of 2350 kc. to 2360 kc. to separate one side band and suppress the remaining signals. The output of the amplifier 44 which constitutes a single frequency is supplied to signal output mixer 45, wherein it is mixed with the signal from the heterodyne oscillator 16 which is connected thereto through a cathode follower 46. The beat between these two signals represents the desired carrier output and is supplied to an amplifier 47 which is tuned to select only the difference frequencies and thus produce a single output signal frequency in the range of 100 kc. to 2000 kc. which however may be phase modulated by the audio signals supplied from the channel 41 to the phase modulator 40. The tuning of the amplifier 47 may be ganged with the heterodyne oscillator 16 to facilitate selection of the desired output frequency. This output frequency is thus made accurately and continuously adjustable over the range of 100 kc. to 2000 kc. by the manipulation of the dial controlling the heterodyne oscillator 16 which selects the nearest fixed frequency interval and the dial controlling the interpolation oscillator 35 which sets the frequency to the desired point between the fixed intervals.

A reactance modulator 50 may be connected to the interpolation oscillator 35. The reactance modulator is adapted to respond to direct current or alternating current signals of the facsimile type or D. C. carrier shift signals. Hence the output signal from the amplifier 47 may contain any of the various types of modulation which can be supplied either to the phase modulator 40 or to the reactance modulator 50.

In adjusting this system the coarse frequency dial is used to tune the amplifier 13 and adjust the heterodyne oscillator 16 to the particular 10 kilocycle step selected, whereupon the correction motor 31 tunes the heterodyne oscillator 16 accurately to the selected frequency. The interpolation oscillator 35 is then set to the particular frequency within this 10 kc. range at which it is required to operate.

Thus the coarse frequency dial can be marked in steps of 10 kc. over the output frequency range and is set to the nearest lower 10 kc. interval of the desired output frequency and the interpolation oscillator dial can be marked over the frequency range of 0 to 10 kc. and is set to the remaining cycles of the desired frequency. The sum of the two dials then gives the correct output frequency, the interpolation oscillator dial acting as a vernier.

It will be noted that in the above system wherever it is necessary to separate difference frequencies the frequencies are spaced by a substantial frequency percentage. Hence no selection difficulty is encountered. Furthermore it is not necessary to separate the different harmonics completely in the tuned amplifier 13 as the harmonics are used only for stabilizing the oscillator which generates a pure frequency. Hence there is no possibility of having related frequencies superimposed upon the oscillator output.

A neon light may be connected to the output feeding the correction motor if desired to indicate when the output is at zero beat.

The least stable element of the system is the interpolation oscillator. However, the interpolation oscillator may be made stable within about .01% variation which at 50 kc. is equivalent to 5 cycles. Hence the system as a whole possesses a high degree of cyclic stability.

Since modulation of various types can be introduced into the system at various points, the output is extremely versatile and the modulation can be accomplished without affecting the stability of the system.

What is claimed is:

1. A frequency stabilized transmitting system operable at a plurality of stabilized frequencies spaced at fixed intervals, comprising a stable single frequency oscillator, a harmonic generator controlled by said stable oscillator and generating a series of harmonics, an amplifier fed by said harmonic generator and tunable to select one of said series of harmonics thereof, a frequency multiplier connected to multiply the frequency of said stable oscillator to a selected multiple thereof, a variable heterodyne oscillator, means combining the output of said heterodyne oscillator with said selected harmonic, said heterodyne oscillator being adjusted to produce a beat frequency approximating the selected multiple frequency from said frequency multiplier, correction means connected to adjust the frequency of said heterodyne oscillator and responsive to the error between said beat frequency and said selected multiple frequency, said correction means being operable in a sense to correct said error and thereby produce a zero frequency difference between said beat frequency and said selected multiple frequency, whereby said heterodyne oscillator is stabilized at frequency intervals corresponding to the separation of the harmonics of said harmonic generator, a single tuning control connected to adjust said heterodyne oscillator and to tune said amplifier in unison to maintain a constant beat frequency, additional frequency multiplying means connected to multiply the frequency of said stable oscillator, and means combining said last multiplied frequency with the output of said heterodyne oscillator to produce a difference frequency which is stabilized at said frequency intervals.

2. A frequency stabilized transmitting system operable at a plurality of stabilized frequencies, comprising a stable single frequency oscillator, a harmonic generator controlled by said stable oscillator, an amplifier fed by said harmonic generator and tunable to select a harmonic thereof, a frequency multiplier connected to multiply the frequency of said stable oscillator to a selected multiple thereof, a variable heterodyne oscillator, means combining the output of said heterodyne oscillator with the selected harmonic to produce a beat frequency approximating the selected multiple frequency from said frequency multiplier, correction means connected to adjust the frequency of said heterodyne oscillator and responsive to the error between said beat frequency and said selected multiple frequency, said correction means being operable in a sense to correct said error whereby said heterodyne oscillator is stabilized at frequency intervals corresponding to the separation of the harmonics of said harmonic generator, an adjustable interpolation oscillator, and a circuit combining the output of said last oscillator with the output of said heterodyne oscillator to produce a stabilized output corresponding to the beat frequency of said last oscillators.

3. In a system as claimed in claim 2, a circuit connected to frequency modulate the output of said interpolation oscillator.

4. In a system as claimed in claim 2, a phase splitting circuit fed by said frequency multiplier and producing two output waves displaced in phase by 90° which are combined with said beat frequency to provide a pair of error signals of 90° phase difference, said correction motor being responsive to said error signals.

5. In a system as claimed in claim 4, means deriving a carrier wave from said phase splitting circuit, means phase modulating said carrier, means multiplying the frequency thereof to increase the phase swing, a balanced modulator fed by said last carrier and connected to be modulated by said interpolation oscillator, means selecting a single side band from the output of said balanced modulator and means combining said single side band with the output of said heterodyne oscillator.

6. In a system as claimed in claim 2, a reactance modulator and means modulating said interpolation oscillator thereby.

7. A frequency stabilized transmitting system operable at a plurality of stabilized frequencies, comprising a stable single frequency oscillator, a harmonic generator controlled by said stable oscillator, an amplifier fed by said harmonic generator and tunable to select a harmonic thereof, a frequency multiplier connected to multiply the frequency of said stable oscillator to a selected multiple thereof, a variable heterodyne oscillator, means combining the output of said heterodyne oscillator with the selected harmonic to produce a beat frequency approximating the selected multiple frequency from said frequency multiplier, a correction motor connected to adjust said heterodyne oscillator, a correction circuit responsive to the error between said beat frequency and said selected multiple frequency connected to actuate said correction motor in a sense to correct said error whereby said heterodyne oscillator is stabilized at frequency intervals corresponding to the separation of the harmonics of said harmonic generator, an adjustable interpolation oscillator, and a circuit combining the output of said last oscillator with the output of said heterodyne oscillator to produce a stabilized output corresponding to the beat frequency of said last oscillators.

8. A frequency stabilized transmitting system operable at a plurality of stabilized frequencies, comprising a stable single frequency oscillator, a harmonic generator connected to operate at a selected submultiple of the said single frequency, an amplifier fed by said harmonic generator and tunable to select a harmonic thereof, a frequency multiplier connected to multiply the frequency of said stable oscillator to a selected multiple thereof, a variable heterodyne oscillator, means combining the output of said heterodyne oscillator with the selected harmonic to produce a beat frequency approximating the selected multiple frequency from said frequency multiplier, a correction motor connected to adjust said heterodyne oscillator, a correction circuit responsive to the error between said beat frequency and said selected multiple frequency connected to actuate said correction motor in a sense to correct said error, whereby said heterodyne oscillator is stabilized at frequency intervals corresponding to the separation of the harmonics of said harmonic generator, an interpolation oscillator, a reactance modulator connected to modulate the output thereof, and a circuit combining the output of said heterodyne oscillator with the output of said interpolation oscillator to produce a stabilized output corresponding to the combined frequencies of said last oscillators.

References Cited in the file of this patent

UNITED STATES PATENTS

| Number | Name | Date |
|---|---|---|
| 2,250,104 | Morrison | July 22, 1941 |
| 2,400,648 | Korman | May 21, 1946 |
| 2,581,594 | MacSorley | Jan. 8, 1952 |
| 2,595,608 | Robinson et al. | May 6, 1952 |